United States Patent
Iasso et al.

(10) Patent No.: US 7,341,193 B2
(45) Date of Patent: Mar. 11, 2008

(54) PORTABLE DIAGNOSTIC DEVICE

(75) Inventors: Daniel Iasso, Lincoln Park, NJ (US);
Peter Sun, West Orange, NJ (US);
Michael Pierce, Wayne, NJ (US);
Brian Stouchko, Somerville, NJ (US)

(73) Assignee: Siemens Building Technologies, Inc., Buffalo Grove, IL (US)

( * ) Notice: Subject to any disclaimer, the term of this patent is extended or adjusted under 35 U.S.C. 154(b) by 443 days.

(21) Appl. No.: 11/013,071

(22) Filed: Dec. 15, 2004

(65) Prior Publication Data

US 2005/0139682 A1 Jun. 30, 2005

Related U.S. Application Data

(63) Continuation of application No. 10/199,517, filed on Jul. 19, 2002, now Pat. No. 6,851,612.

(60) Provisional application No. 60/306,778, filed on Jul. 20, 2001.

(51) Int. Cl.
*G06K 7/10* (2006.01)

(52) U.S. Cl. ............... 235/472.01; 235/492; 235/451; 340/514

(58) Field of Classification Search ........... 235/472.01, 235/492, 451; 340/506, 508, 514, 538, 586; 345/156

See application file for complete search history.

(56) References Cited

U.S. PATENT DOCUMENTS

| | | | | | |
|---|---|---|---|---|---|
| 4,329,643 | A | * | 5/1982 | Neumann et al. | 324/763 |
| 5,511,108 | A | * | 4/1996 | Severt et al. | 379/21 |
| 5,724,023 | A | * | 3/1998 | Takahashi et al. | 340/516 |
| 6,179,214 | B1 | * | 1/2001 | Key et al. | 236/51 |
| 6,380,860 | B1 | * | 4/2002 | Goetz | 340/586 |
| 6,459,370 | B1 | * | 10/2002 | Barrieau et al. | 340/514 |
| 6,545,479 | B1 | * | 4/2003 | Dollar et al. | 324/424 |

\* cited by examiner

*Primary Examiner*—Steven S. Paik

(57) ABSTRACT

A portable, preferably hand-held device is provided which may be used to test device loops in fire safety systems for short circuits, open circuits, ground faults and can test the response of the devices in the loop before or after the device loop is connected to the system.

26 Claims, 10 Drawing Sheets

PORTABLE DIAGNOSTIC DEVICE

This is a continuation of Ser. No. 10/199,517, filed July 19, 2002, now U.S. Pat. No. 6,851,612 issued on Feb. 8, 2005 which claims the benefit of U.S. Provisional Patent Application Ser. No. 60/306,778, filed July 20, 2001, which in its entirety is incorporated by reference herein.

CROSS-REFERENCE TO RELATED CO-PENDING APPLICATIONS

The following patent applications cover subject matter related to the subject matter of the present invention: "Fire Detection System Including an Automatic Polarity Sensing Power and Signal Interface" U.S. Pat. No. 6,738,238; "Fire Protection System and Method for Configuring U.S. Pat. No. 6,829,513"; "User Interface for Fire Detection System" U.S. Pat. No. 6,907,300; "User Interface with Installment Mode" U.S. Ser. No. 10/199,801.

BACKGROUND OF THE INVENTION

The present invention relates to a fire safety system comprised of a plurality of device loops, and is directed more particularly to a hand-held device that may be detachably connected in a testing relationship to at least one of the device loops in the fire safety system.

Fire safety systems typically include a number of device loops, where each device loop is typically comprised of a plurality of devices such as smoke detectors, heat detectors and manual pull-stations, which are provided as discrete elements. These device loops are controlled by a central station, such as a control panel. The devices in the device loops may be monitored and controlled from the control panel which receives operational information from the devices.

In view of the foregoing, it will be seen that, prior to the present invention, there has existed a need for a portable device which could be used to facilitate the testing of device loops for ground faults and other problems, which could be used to increase the productivity of those that service the system and the reliability of the system as a whole, and which also may be used to test individual devices.

SUMMARY OF THE INVENTION

In accordance with the present invention, there is provided a hand-held device that facilitates the programming and testing of devices and one or more device loops in a building system such as a fire safety system.

Generally speaking, the present invention comprises a portable, preferably hand-held device that includes a detector base for programming and testing devices and one or more connector plugs through which the hand-held device may be connected to a device loop for testing the device loop. Using the present invention, a user can test a device loop for short circuits, open circuits, ground faults and can test the response of the devices in the loop before or after the device loop is connected to the system.

By connecting a programming cable from the hand-held device to a device loop, the device loop may be tested for opens or shorts. The devices will also be polled and the display of the hand-held device will show a summary screen of the different types of devices connected and also the address at which the devices are responding.

By connecting the programming cable to the loop and then connecting the ground cable connection to an earth ground, the detector loop may be tested for ground faults.

Generally, speaking it is an object of the invention to provide a control panel for monitoring and controlling one or more device loops. In the present invention, each device loop comprised of a plurality of devices for reporting predetermined system events back to the control panel. A hand-held device is preferably provided with a display and may be operably connected to one or more device loops to be tested. The one or more device loops may then be operatively connected to said system after being tested by said hand-held device.

BRIEF DESCRIPTION OF THE DRAWINGS

Other objects, features and advantages of the present invention can be appreciated by referencing the following description of the presently preferred embodiment in conjuction with the drawings, where.

DETAILED DESCRIPTION OF THE PREFERRED EMBODIMENT

The present invention relates to a hand-held loop tester device that may be used to test loops in a fire safety system before or after the loops are connected to the system. The hand-held device checks that all of the devices in the loop are communicating and also checks for ground faults and short circuits. By using the loop test feature, all troubles can be cleared from the device loop before it is connected to the control. Further, troubles in device loops already connected to the central station can be more readily detected.

Figure 1:
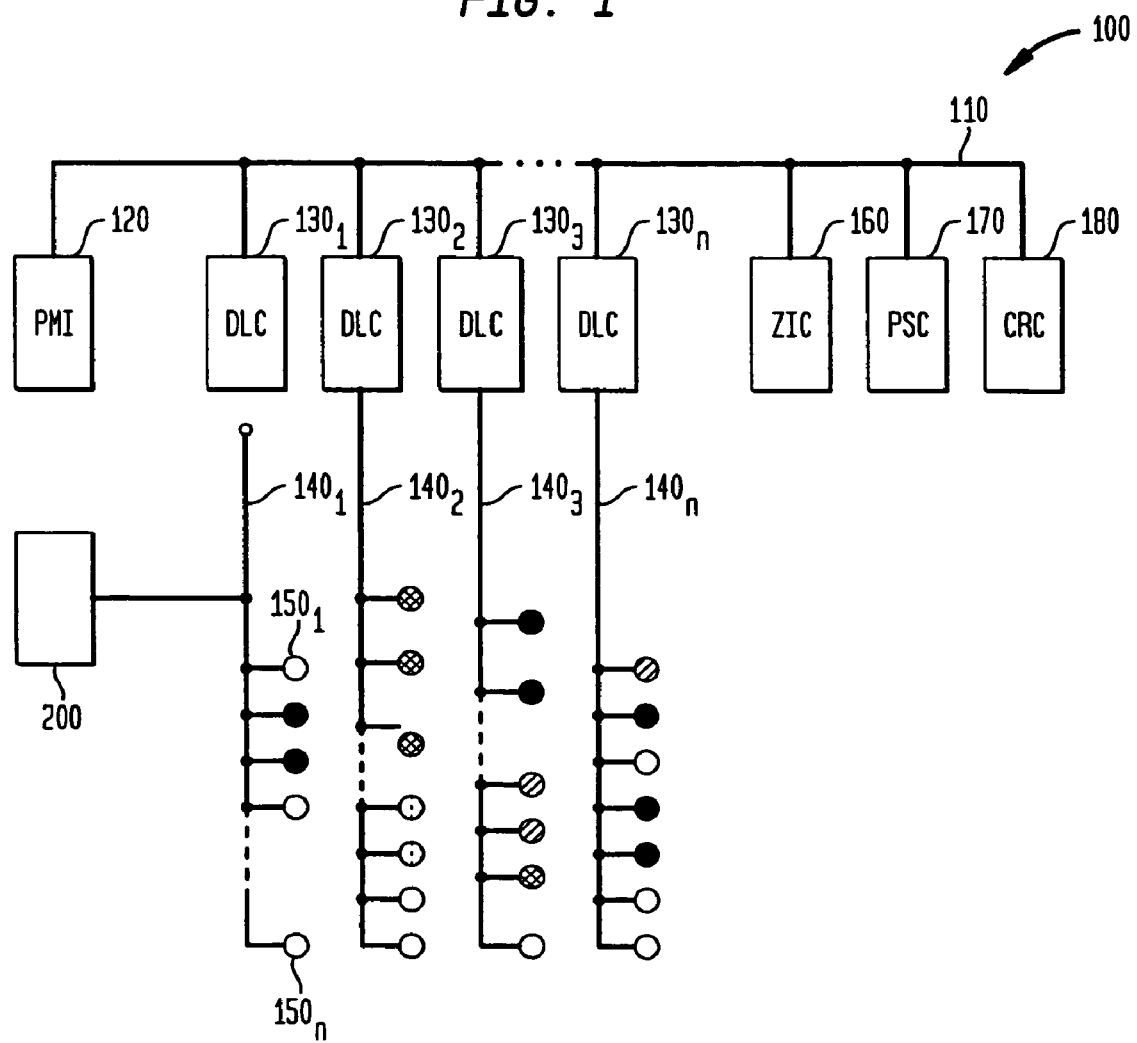
FIG. 1 is a block diagram of a fire safety system and a hand-held device with the hand-held device connected to a device loop which has not been attached to the fire safety system.

Referring to FIG. 1, a system upon which an embodiment of the present invention can be implemented is shown as 100. System 100 is comprised of a bus 110, or other communications hardware or software, for communicating information and signals. A person-to-machine interface PMI 120, coupled to bus 110, is used to view system information and to input control data.

Figure 2:
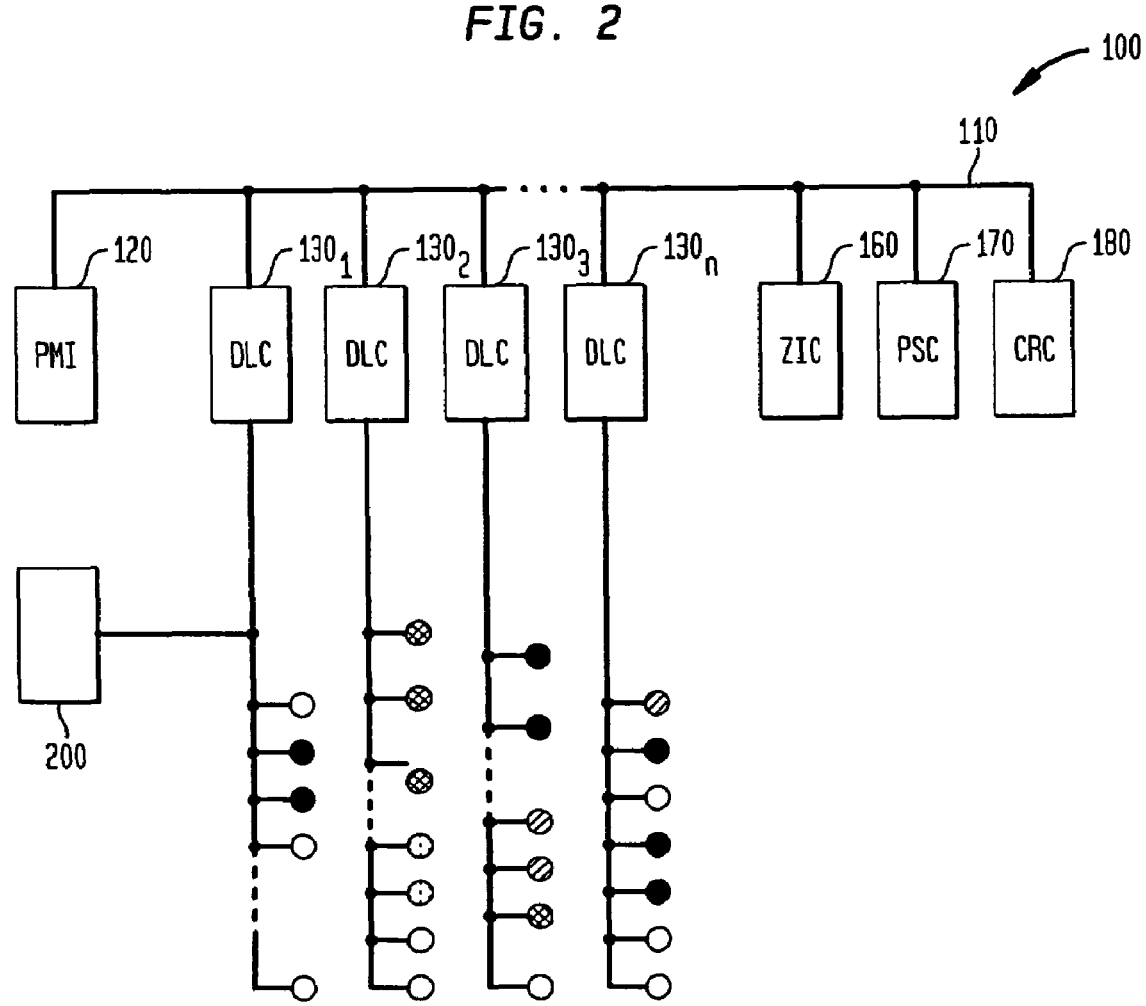
FIG. 2 is a block diagram of a fire safety system and a hand-held device with the hand-held device connected to a device loop which is operably connected to the fire safety system.

System 100 further comprises one or more device loop controllers $130_1$-$130_n$ coupled to the bus 110 for controlling device loops $140_1$-$140_n$. Each device loop 140 is comprised of up to 252 devices $150_1$-$150_n$ of different types, such as detectors, manual pull stations, digital inputs or relay output devices in any combination on the device loop. Each device loop controller 130 is the central communication point for the devices on the device loop 140. Each device loop controller 130 communicates with these device loops 140 via a protocol. Each device loop 140 consists of two independent parallel zones. Each zone may be electronically isolated should a short occur, without affecting the remaining zone. Each device loop controller 130 initializes, operates, and maintains all devices residing on the device loop 140 and communicates all relevant device and event information, such as alarms and troubles, to the interface 120. Each device loop controller 130 allows the system 100 polarity insensitive devices to be connected without generating errors. By adding further device loop controllers 130 in system 100, the system 100 can be expanded to support thousands of intelligent detectors and devices spread across a flexible number of device loops $140_1$ to $140_n$. Hand-held device 200 is operatively connected to a device loop 140 for testing the operation of the device loop. As shown in FIG. 1, the device loop 140 had not yet been operatively connected to device loop controller 130. FIG. 2 is similar in all respects to FIG. 1, except the device loop 140 is operatively connected to device loop controller 130.

The system 100 further comprises zone indicating module 160 coupled to bus 110 which provides power to and communications with annunciation devices (alarms, strobes, etc) in the system 100. These annunciation devices can be software configured for a wide variety of functions—such as standard NAC operation (bells, horns, chimes), strobes (synchronized or non-synchronized), coded audibles (Temporal Code 3, Marchtime, Zone Coded, etc.), Municipal Tie, Leased Line, Extinguishing agent releasing (FM-200 or Halon) or sprinkler pre-action and deluge applications.

The system 100 also comprises power supply module 170 coupled to bus 110 for supplying power to the modules operably connected to bus 110. The system further includes control relay module 180 connected to bus 110. This module 180 provides multiple relays with which to operate devices such as bells, horns, strobes, etc.

Each module in the system 100 has its own microprocessor. To ensure reliable operation, if the CPU of interface 120 stops, these modules, operating in degrade, still annunciate any alarm or trouble through common lines called Any Alarm and Any Trouble. Preferably, all of the modules communicate with the CPU of the interface 120 through an RS-485 network communications system. The microprocessor of each device loop controller 130 controls the on-board isolator to isolate either zone from the device loop 140 if one of them is shorted. When one zone is isolated from the device loop 140, the other zone will still work. The on-board microprocessor provides the device loop controller 140 with the ability to function and initiate alarm conditions even if the CPU of interface 120 fails.

Figure 3:
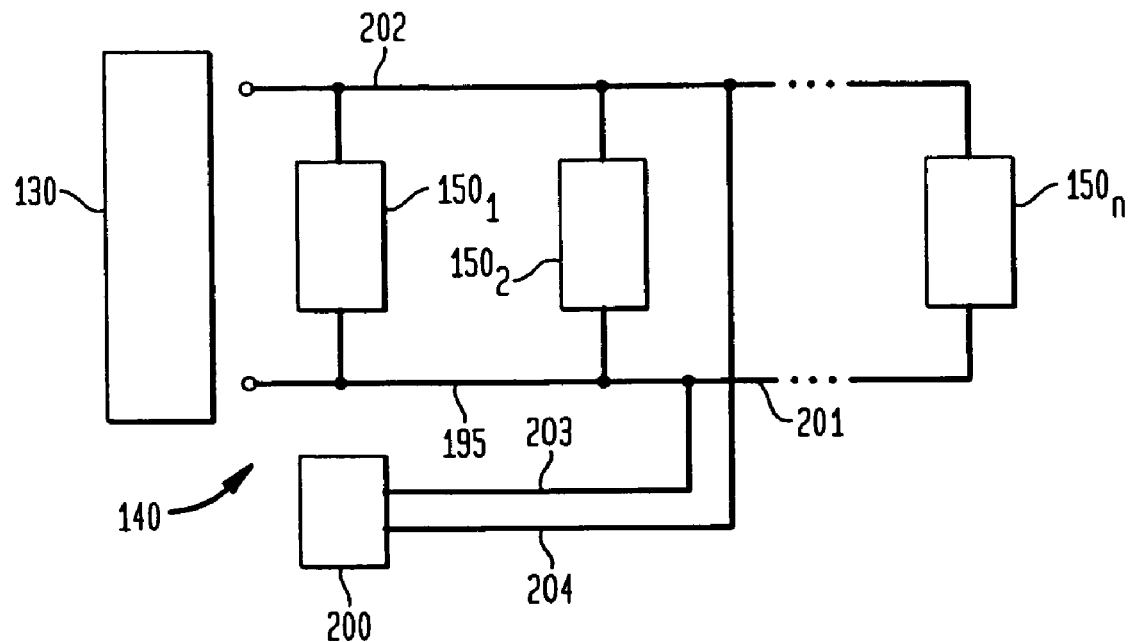
FIG. 3 is a block diagram showing in greater detail the connection between the hand-held device and a device loop before the device loop has been connected to the fire safety system.
Figure 4:
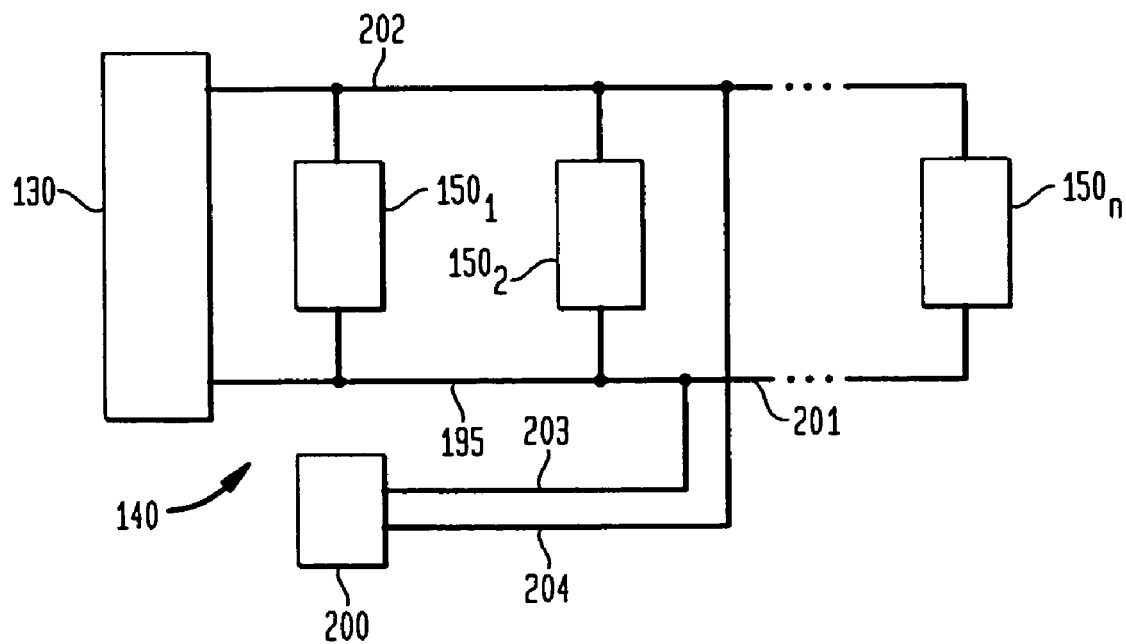
FIG. 4 is a block diagram showing in greater detail the connection between the hand-held device and a device loop after the device loop has been operatively connected to the fire safety system.

FIG. 3 is a block diagram showing in greater detail how the hand-held device is connected to a device loop. As shown in FIG. 3, a device loop controller 130 is connected to a plurality of devices $150_1$-$150_n$ through a pair of lines 210 and 202. Hand-held device 200 is connected to line 210 of the device loop 140 through line 203 and to line 202 of the device loop 140 through line 204. As shown in FIG. 3, lines 210 and 202 are not yet operatively connected to device loop controller 130. FIG. 4 is an alternative embodiment where lines 210 and 202 are operatively connected to device loop controller 130.

Figure 5:
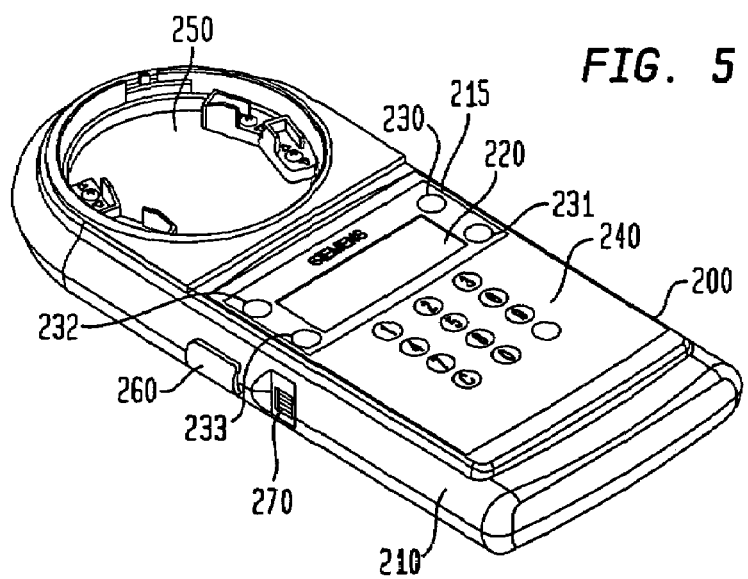
FIG. 5 shows an embodiment of the present invention with display and keypad for user input.

In accordance with the present invention, the above-described problem is solved by providing a portable, preferably hand held device, best shown in FIG. 5. As depicted, a hand-held device 200 includes a housing 210, interface 215 including display 220 and buttons 230-233, a keypad 240 and detector base 250. Display 220 is provided to display the information such as test configuration and test results. The display 220 preferably comprises a liquid crystal display of the type that includes a back-light in order to ensure that data presented may be read both under dim indoor lighting conditions and under bright outdoor lighting conditions. The hand-held device 200 further includes power switch 260 and external power/battery charging connector 270.

Figure 6:
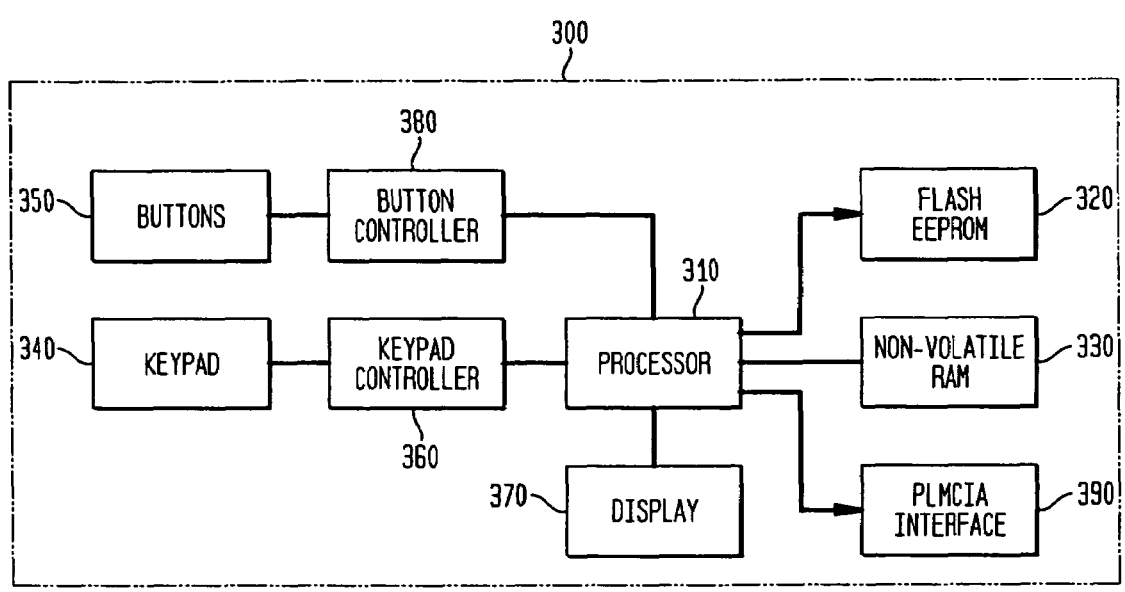
FIG. 6 is a block diagram of the control architecture for the hand-held device of the present invention.

FIG. 6 shows a block diagram of the control architecture 300 of the present invention. A microprocessor 310 controls the operation of the device 200 according to stored program instructions in memory, such as FLASH EEPROM 320 and non-volatile RAM 330 and user input from keypad and buttons 350. A keypad controller 360 receives input from keypad 340 and translates this input into input for microprocessor 310. Device status, test configuration and test results are stored in a non-volatile RAM 330 which may be displayed on graphic display 370 connected to the microprocessor 310. A button controller 380 receives inputs from buttons 350 and translates this input into input for microprocessor 310. The control architecture 300 may also include a PCMCIA interface 390 to permit porting of the device using standard PCMCIA hardware.

Figure 7:
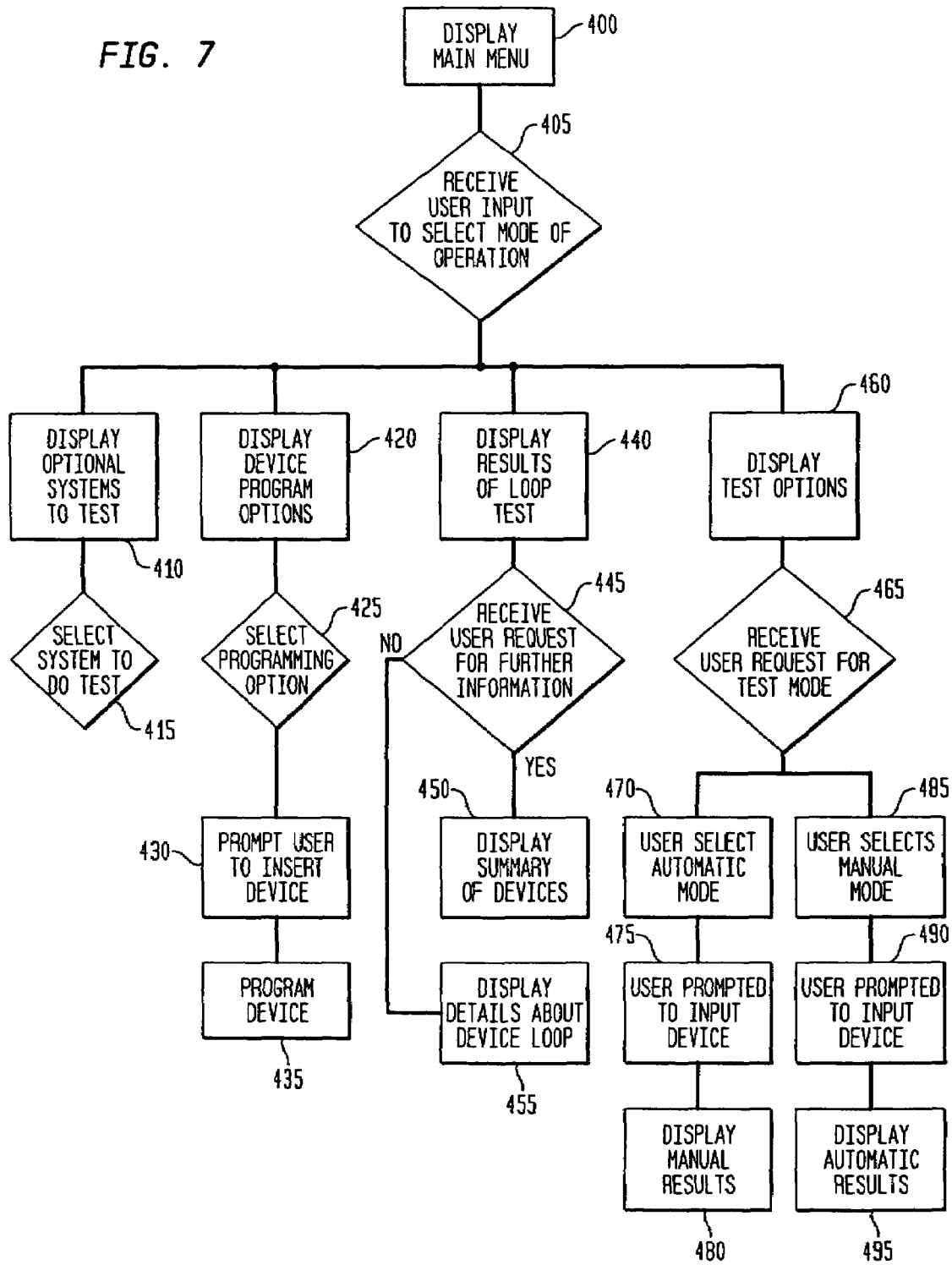
FIG. 7 is a flowchart of the operation of the hand-held device.

Referring now to FIG. 7, a flowchart is shown illustrating different functions provided by the hand-held device of the present invention. A user may turn on the hand-held device 200 shown in FIG. 6 by pressing the power switch 260 on the left side of the hand-held device. Display 220 of the interface 215 of the device 200 will initially display a power up screen for about five seconds and then will display the main menu screen shown in FIG. 8 (Block 400). As shown in FIG. 9, using buttons 230-233 adjacent display 200 of interface 215, a user may choose to test a device loop, test a device, change a system setting or program a device (Block 405).

The present invention allows users to both test devices and device loops in more than one type of system. If the system setting needs to be changed, the user can press the button 233 adjacent the SETUP display on display 220 of interface 215 (Block 410). In the next screen, not shown, the user can then press the button adjacent the display SYSTEM on display 220. The resulting display on display 220 of interface 215 is shown in FIG. 9. Then, using one of the buttons, 230 or 232 for example, the user may then select a system to test (Block 415). For example purposes only, using the present invention, the user has the option of selecting either the Siemens Building Technologies MXL® or FireFinder™ systems for loop testing.

Figure 10:
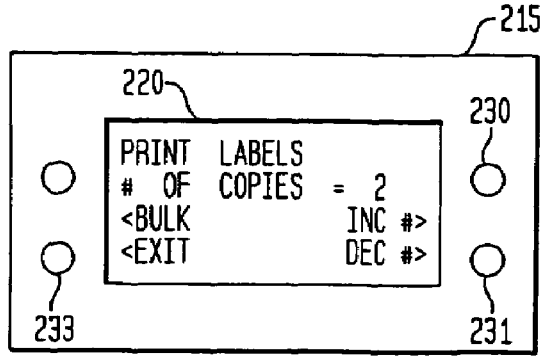
FIG. 10 is an illustration of the hand-held display when selecting the number of labels to be printed.

If a label printer is to be used to print labels, it is also necessary to set the number of labels to be printed when the device is programmed. To do this, the user can press the button 233 adjacent to the display SETUP on the display 220 of the interface 215, and can then press a button adjacent to the display PRINTER in the next screen (not shown) on the display 220. The resulting display on display 220 of interface 215 is shown in FIG. 10. The user can use the buttons 230 and 231 adjacent the INC# (increase number) or DEC# (decrease number) displays on the display 220 to set the number of copies between 0 and 3 then press button 233 next to the EXIT display on display 220 twice to return to the main menu. With the correct system settings on the hand-held device 200 and the label printer connected, one two or three labels may be printed as each detector or device is programmed. A loop number may be set on the front panel which will also be printed as the label is printed even though the loop number is not programmed into the detector or device. The hand-held device 200 may also be setup to print labels for a range of addresses all in one shot.

Figure 11:
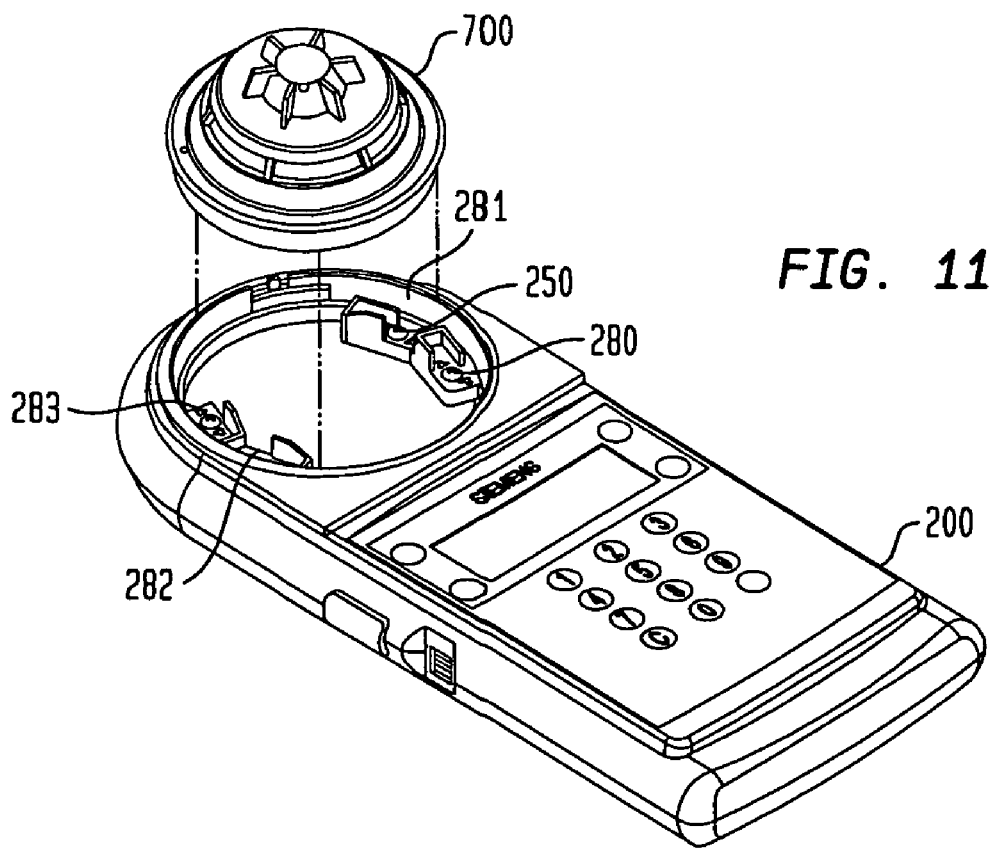
FIG. 11 is an orthogonal illustration of the hand-held device being used to test and program an individual device.

In one embodiment of the present invention, the hand-held device 200 may be used to program devices. FIG. 11 shows a device 700 being inserted into the detector base 250. To insert a device 700 into the detector base 250, the detector's LED (not shown) should be aligned with the LED symbol (not shown) on the base portion of the hand-held device 200. The detector 700 can then be inserted into the detector base for testing or programming. When the detector 700 drops into the detector base 250 the four contact areas (not shown) in the bottom of the detector 700 will touch four spring contacts 280-283 mounted in corresponding positions in the bottom of the molded detector base 250. The user must push the detector 700 in further overcoming the force of the spring contact and then rotate clockwise as far as possible to lock the detector 700 into the detector base 250. This will maintain the four electrical connections between the detector 700 and the hand-held device 200 while programming and testing in performed.

Figure 12:
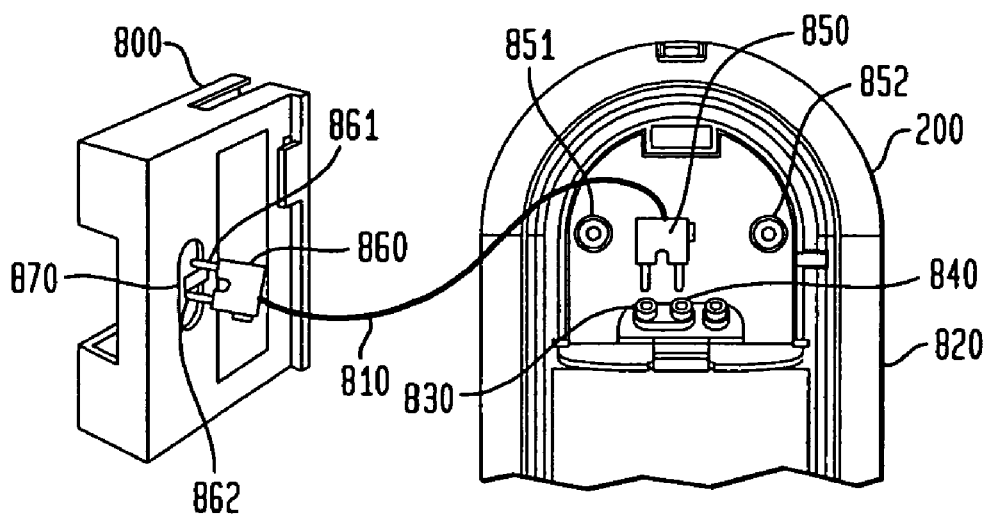
FIG. 12 is a plan illustration of the appearance of the back of the hand-held device and its connections to a device to be tested and programmed.

In an alternative embodiment as shown in FIG. 12, device 800, such as a manual pull-station, can be connected to the hand-held device 200 using a cable 810. The bottom 820 of the hand-held device 200, the side opposite the display 220 and keypad 230, is provided with a pair of banana jacks 830 and 840. One end of the cable 810 is provided with a programming plug 850. Programming plug 850 is provided with prongs 851 and 852 which can be inserted into banana jacks 830 and 840. The other end of cable 810 is provided with programming plug 860 which includes prongs 861 and 862. Using programming plug 860, the cable 240 can be connected to the programming points 870 of the device 200. While FIG. 12 illustrates the use of a cable with a pair of programming plugs to connect the hand-held device to a fire safety system device, other methods known in the art may be used to operatively connect the hand-held device to fire safety system devices.

The hand-held device 200 may be used not only to set the address of detectors or devices, but can be used to provide configuration data such as ASD settings, usage, and the polarity of the inputs on detectors. In an alternative embodiment, the ASD settings, usage, and the polarity of the inputs on detectors are sent from the control panel.

Figure 8:
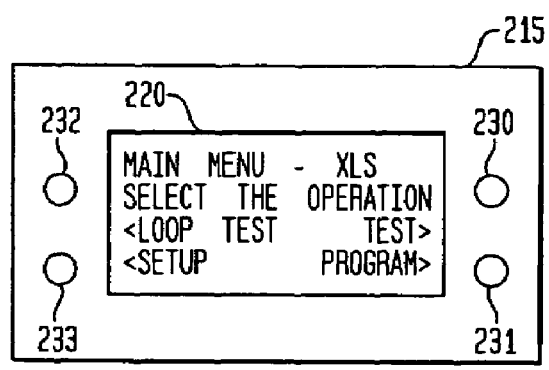
FIG. 8 is an illustration of the main menu of the hand-held unit.
Figure 9:
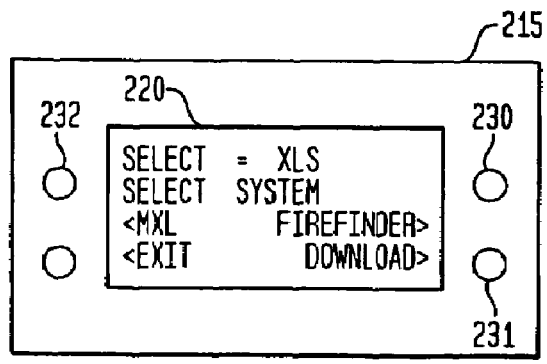
FIG. 9 is an illustration of the hand-held display when selecting a system setting.
Figure 13:
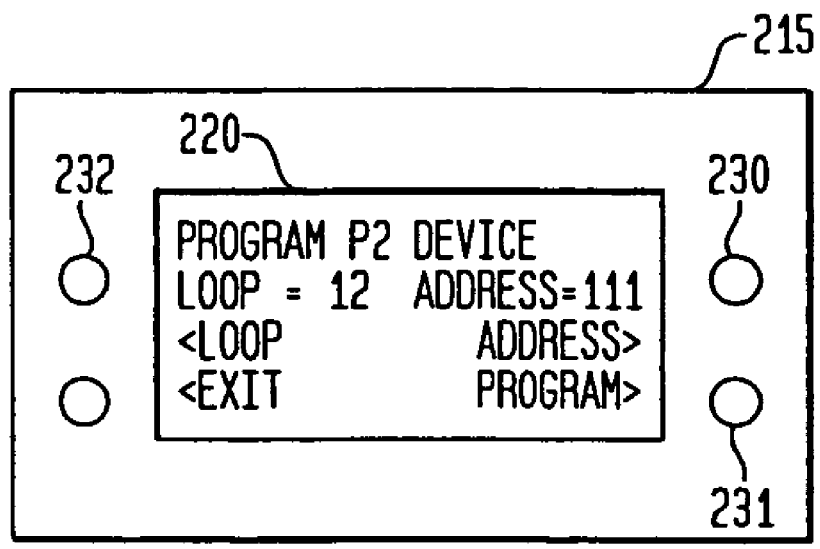
FIG. 13 is an illustration of the hand-held display when programming a device.

Referring to FIGS. 5 and 8, if a user wishes to program a device, the user can begin by pressing the button 231 adjacent to the PROGRAM display on display 220. Display 220 of interface 215 will then show the display shown in FIG. 13 providing the user with several programming options (Block 420). By pressing the buttons 230 and 232 adjacent the LOOP and ADDRESS displays on the display 200 of interface 215, the user can change loop and address settings. To begin programming a device, the user can press the button 231 adjacent the PROGRAM display on display 220 of interface 215 (Block 425). The display 220 of the hand-held device 200 will prompt the user to insert or connect a device (Block 430). Once the device 700 or 800 is connected, the hand-held device will program the address (Block 435). If the detector or device is programmed successfully, the hand-held device 200 will print the number of labels selected at setup and the display 220 of interface 215 will display the message PROGRAMMED OK, as shown in FIG. 14.

Figure 14:
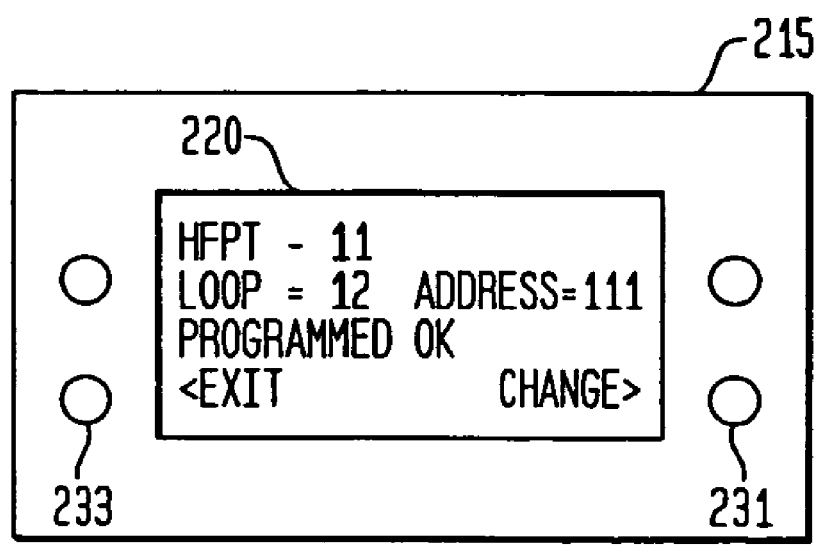
FIG. 14 is an illustration of the hand-held display when a device has been programmed successfully.

Referring to FIG. 14, a user wishing to return to the main menu may press the button 233 adjacent to the EXIT display on display 220. A user may change the current setting of the or device 700 or 800 by pressing the button 231 adjacent to the CHANGE display on display 220 to return to the loop and address setting screen. Removing or disconnecting the device 700 or 800 will automatically increment the address and return to the programming display.

Figure 15:
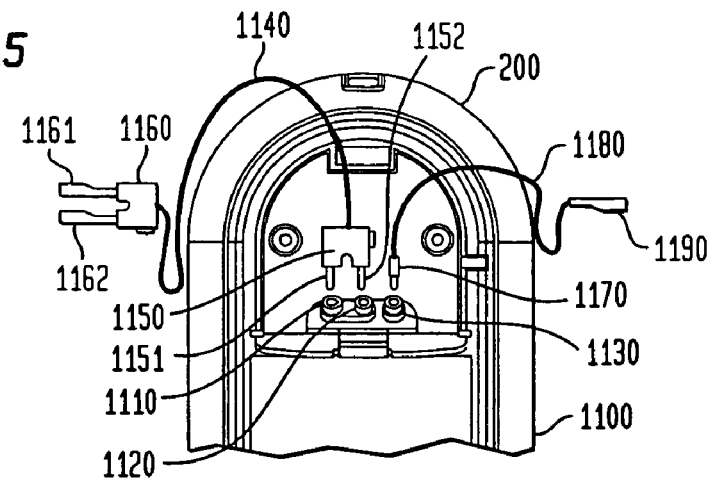
FIG. 15 is a plan illustration of the appearance of the back of the hand-held device and its connections to a device loop to be tested.

FIG. 15 shows how the hand-held device may be connected to a device loop for testing. As shown in FIG. 15, the back 1100 of the hand-held device 200 is provided with jacks 1110, 1120 and 1130. The hand-held device 200 may be plugged into an AC wall outlet using an external power supply or may be provided with an internal power source. A cable 1140 comprising programming plug 1150 is plugged into jacks 1110 and 1120 using prongs 1151 and 1152. Cable 1140 further comprises programming plug 1160 comprising two clips 1161 and 1162. Each clip 1161, 1162 is attached to a line in the device loop. Next, a plug 1170 of cable 1180 is inserted into jack 1130. Clip 1190 of cable 1180 is then connected to earth ground.

Figure 16:
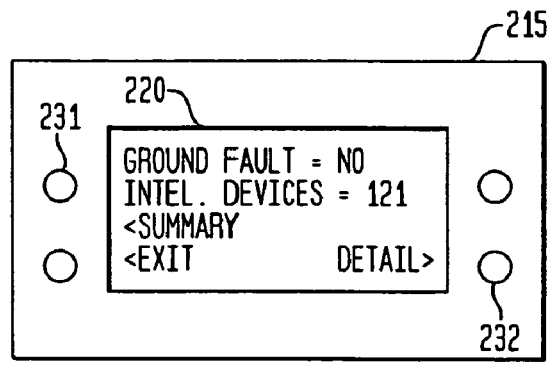
FIG. 16 is an illustration of the hand-held display when a device loop has been tested for ground faults.

Referring to FIGS. 1, 5, 8 and 15, once the hand-held device 200 is connected to the device loop 140, with the display 200 of the hand-held device 200 displaying the Main Menu, the user may press the button 232 adjacent to the LOOPTEST display in display 220 as shown in FIG. 8. The display 220 of interface 215 will show a display similar to FIG. 16 (Block 440). The top line of the display 220 shown in FIG. 16 indicates if there are any ground faults on the device loop 140. The second line indicates how many devices 150 the hand-held device 200 has detected on the device loop 140. It may take more than a minute to detect all of the devices 150 on the device loop. The count will continue to increment as each additional device 150 or detector is recognized. The display 220 of the interface 215 shown in FIG. 16 provides the user the option to obtain a summary of the devices in the device loop, or further information about the address location of devices (Block 445).

Figure 17:
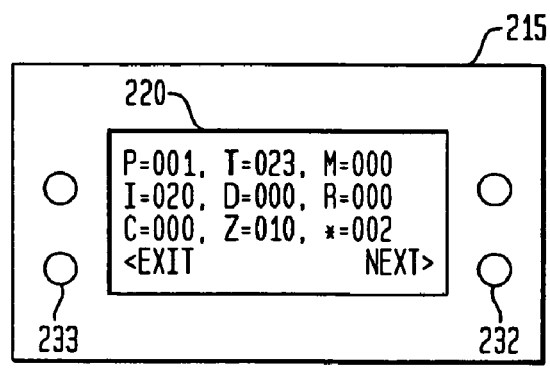
FIG. 17 is an illustration of the hand-held display when a summary of the devices in a device loop being tested is displayed.

The user of the present invention may press the button 231 adjacent to the SUMMARY display on display 220 of interface 215 to get a summary count of all of the different devices on the loop (Block 450). The resulting display 220 of interface 215 is shown in FIG. 17. A letter indicates the type of device 150 as shown in TABLE 1 below. The number to the right of the letter indicates the quantity of those devices 150 found on the loop. For example, P=001 indicates one HFP photo/thermal detector device 150 was found on the device loop 140.

TABLE 1

DPU Loop

| Test Letter | Model | Description |
|---|---|---|
| — | | No response |
| P | HFP-11 | Photo/Thermal Smoke Detector |
| P | HFP-11E | Photo/Thermal Smoke Detector - Extended Temp range |
| T | HFPT-11 | Thermal Detector |
| T | HFPT-11E | Thermal Detector - Adjustable - Extended Temp range |
| T | HFPT-11L | Thermal Detector - Adjustable - Low Temp range |
| I | HTRI-S | Switch Monitor Module |
| D | HTRI-D | Switch Monitor Module - Dual input |
| R | HTRI-R | Switch Monitor Module-Single input-Single relay output |
| R | HTRI-RD | Switch Monitor Module - Single input - Dual relay output |
| I | HTRI-M | Switch Monitor Module - Small profile - Mini |
| M | HMS-S, -D, -M | Manual Pull Station/ - Dual action/ - Metal |
| 2 | HMS-2S, -SA | Manual Pull Station - 2 Stage (Canadian) |
| C | HCP | Control Point |
| C | HCP-D | Control Point - Dual |
| C | HCP-D | Control Point - Dual |
| Z | HZM | Conventional Zone Module |
| L | HLED | Intelligent Single LED Module |
| B | DB-11HB | Intelligent Isolator Base |
| H | HP-MM | Hazardous Process Monitor Module |
| U | | Unidentified response |
| * Flashing | | Multiple response |

Referring to FIG. 17, a user can display further summary screens by pushing the button 232 next to the NEXT display on display 220 of interface 215. Pressing the button 233 next to the EXIT display on the display 220 of the interface 215 returns the display 220 one screen up to the top of the loop test display.

Figure 18:
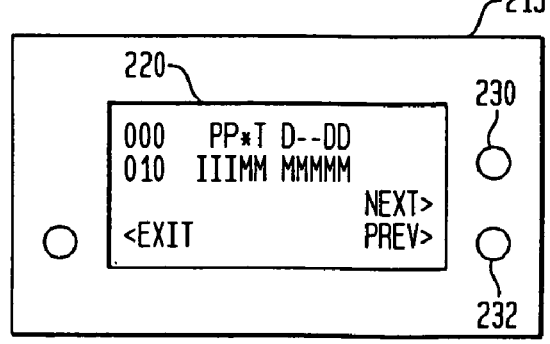
FIG. 18 is an illustration of the hand-held display when device addresses are displayed

Referring to FIG. 16, a user may press the button 232 adjacent to the DETAIL display on display 220 of interface 215 to display the type of device 150 responding at each address. Referring again to TABLE 1, different letters represent the device types. In response to a user input to display the type of device 150 residing at each address, the screen display 220 of interface 215 depicted in FIG. 18 is displayed where the numbers indicate the address and the letters indicate the device types (Block 455). As shown in FIG. 18, the display 220 shows the addresses on the device loop 150 and the devices 150 that are responding at each address. The letters listed in the first column will appear on the display 220 during a loop test. When the letter is flashing, it indicates that the device is in alarm or trouble. For example, in the top line of the display 220, as there is no device located at address 0, the first position is left open. In the next two positions of line one two letters P are displayed. This indicates that Photo/Thermal Smoke Detectors are located at addresses two and three. The display in line two of display 220 shows for example that Switch Monitor Modules are located at addresses 10,11 and 12.

The devices are shown ten to a line, as two groups of five. The starting address appears on the left-hand side of the screen. A user may cycle through twenty addresses at time by pressing the button 230 adjacent to the NEXT display on display 220 or the button 232 adjacent to the PREV display on the display 220. Pressing the button 233 next to the EXIT display 220 will return the user to the Main Menu display 220 shown in FIG. 8.

In another embodiment, the present invention provides for the automatic and manual testing of detectors and devices. Referring to FIG. 8, by pressing the button 230 adjacent the display TEST in display 220, a screen will be displayed on display 220 of interface 215 (Block 460), as shown in FIG. 19, providing the user the option of conducting an automatic test or a manual test (Block 465).

Figure 19:
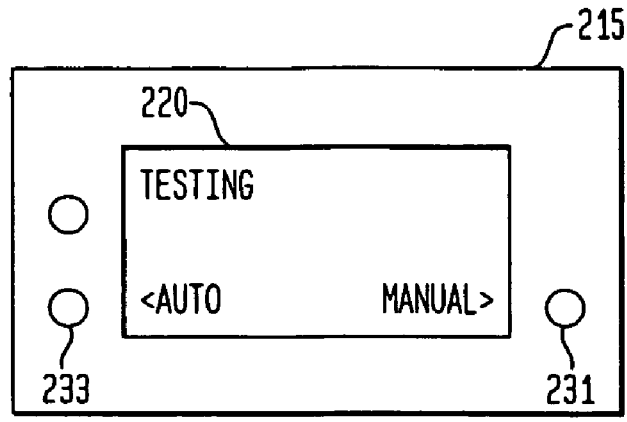
FIG. 19 is an illustration of the hand-held display when the user is provided with the option of manually or automatically testing a device.
Figure 20:
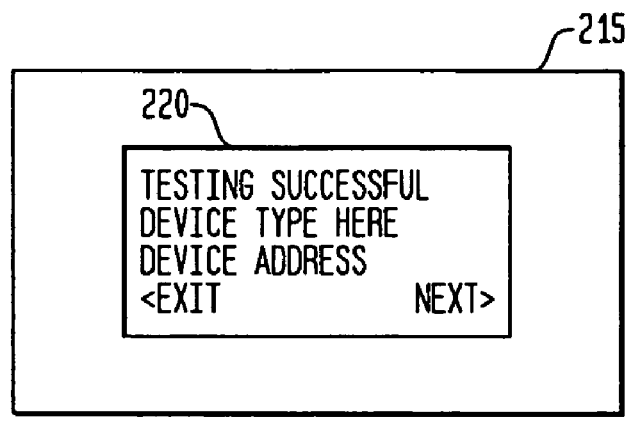
FIG. 20 is an illustration of the hand-held display when a device has been testing using the automatic mode.

If the user selects the button 233 adjacent to the AUTO display in display 220 of interface 215 of FIG. 19 (Block 470), the hand-held device 200 will prompt the user to insert or connect a device (Block 475). When the device is detected, the hand-held device will test the device. As shown in FIG. 20, the hand-held device will display the type of device tested and the address in display 220 of the interface 215 (Block 480).

Figure 21:
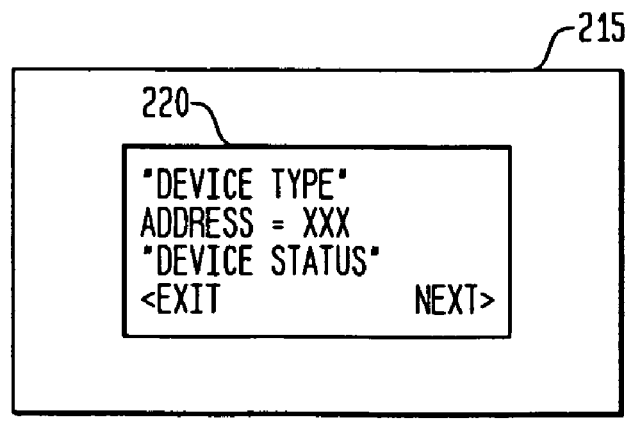
FIG. 21 is an illustration of the hand-held display when a device has been successfully tested using the manual mode.

The option of conducting a manual test allows the user of the hand-held device to read back information about the settings of the device under test. The information displayed will vary depending on the type of system and the devices being tested. Referring again to FIG. 19, the user may conduct a manual test by pressing the button 231 adjacent to the MANUAL display in display 220 (Block 485). The hand-held device 200 will prompt the user for a device to be connected or a detector to be inserted (Block 490). As shown in FIG. 21, when the device or detector if found, the display 220 of interface 215 will show the type of device that has been found, the device address and the current status of the device (Block 495). The user may display further screens of information which will provide the user with further information such as the model number of the device, the address setting of the device, the use that the device has been set to by the system i.e. Alarm, Status, Supervisory. Further information displayed may also include the ASD setting of the detector, the serial number of the device, the IEC setting for the device, the temperature reading of the device and the sensitivity setting of the device.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A system comprising:
   a device loop controller;
   one or more device loops configured to communicate with device loop controller,
      wherein each of said one or more device loops includes a plurality of devices, and
      wherein each of said one or more device loops defines an operatively connected state in which said one or more device loops communicate with said device loop controller, and an operatively disconnected state in which said plurality devices in said one or more device loops communicate with each other;

a hand-held device having a display, said hand-held device configured to:
operatively connect to said one or more device loops when said one or more device loops are in said operatively disconnected state; and
test said one or more device loops when said one or more device loops are in said operatively disconnected state, wherein said one or more device loops are operatively connected to said device loop controller after being tested by said hand-held device, wherein said hand-held device is operatively connected to said one or more device loops to determine whether devices in said one or more device loops are communicating properly.

2. The system according to claim 1, wherein said hand-held device is operatively connected to said one or more device loops and to earth ground to determine whether there is a ground fault in said one or more device loops.

3. The system according to claim 1, wherein a cable is provided between said hand-held device and said one or more device loops for communicating information about said one or more device loops to said handheld device.

4. The system according to claim 1, wherein said hand-held device is provided with a keypad.

5. The system according to claim 1, wherein said hand-held device is configured to display information about at least one device loop in communication with another device loop controller when said at least one device loop is in said operatively connected state.

6. The system according to claim 1, wherein said hand-held device further comprises a connector for directly connecting devices in said one or more of said device loops to said hand-held device for testing or programming or a combination thereof.

7. The system according to claim 1, wherein said hand held device includes an aperture for directly testing and programming individual devices wherein the hand-held device is capable of testing and programming both individual devices and entire device loops.

8. The system according to claim 1, wherein said system is a fire safety system, and said device loops are comprised of smoke detectors.

9. The system according to claim 1, wherein said system is a building control system.

10. A method of using a hand-held device for testing a device loop in a system, the method comprising:
providing a device loop controller;
providing one or more device loops configured for communication with said device loop controller, wherein each of said one or more device loops comprised of a plurality of devices, wherein each of said one or more device loops defines an operatively connected state in which said one or more device loops communicate with said device loop controller, and an operatively disconnected state in which said plurality devices in said one or more device loops communicate with each other;
providing a hand-held device having a display; testing, said one or more device loops in said operatively disconnected state utilizing said hand-held device; and
operatively connecting said one or more device loops to said device loop controller after said one or more device loops have been tested.

11. The method according to claim 10, further comprising displaying information about said device loop on said display.

12. The method according to claim 10, wherein a summary of all of the different types of devices on said one or more device loops is displayed on said display.

13. The method according to claim 10, further comprising displaying information identifying different types of devices in said system and displaying information about how many of each different type of devices are provided in said system.

14. The method according to claim 13, further comprising displaying a symbol on said display for each different type of device in said device loop, and wherein the number of each type of device in said device loop is displayed adjacent to each said symbol.

15. The method according to claim 10, further comprising displaying information about the addresses in said device loop and the devices located at said addresses.

16. The method according to claim 10, further comprising configuring said hand-held device to display information about more than one type of system.

17. The method according to claim 10, further comprising testing or programming one or more individual devices using said hand-held device.

18. The method according to claim 10, further comprising displaying information about said individual devices on said hand-held device.

19. The method according to claim 10, further comprising testing said one or more device loops to determine whether devices in said device loop are communicating properly.

20. The method according to claim 10, further comprising connecting said hand-held device to earth ground testing said one or more device loops for ground faults using said hand-held device.

21. A hand-held device for testing, programming, or a combination thereof, devices and device loops in a system comprising:
a housing;
a display for displaying device and device loop information;
a keypad connected to the housing;
a first connecting device comprised of one or more connectors for connecting the hand-held device to a device loop for testing the device loop,
wherein said device loop defines an operatively connected state in which said device loop communicates with a device loop controller, and an operatively disconnected state in which said devices in said device loop communicates with each other; and
a second connecting device for connecting at least one of said devices directly to the hand-held device for testing or programming or a combination thereof.

22. The hand-held device according to claim 21, wherein said first connecting device is connected to device loops using a cable operatively connected to said one or more connectors and said devices the plurality of connectors are connected to devices and device loops using a cable.

23. The hand-held device according to claim 21, wherein said second connecting device is an aperture in said housing of said hand-held device for securing a device in said housing for testing or programming or a combination thereof.

24. The hand held device according to claim 21, wherein said system is a fire safety system, and said device loops are comprised of smoke detectors.

25. The hand-held device according to claim 21, wherein said system is a building control system.

26. The hand-held device according to claim 21, wherein said device directly connected to said hand-held device is a smoke detector.

* * * * *